(12) United States Patent
Schlottig et al.

(10) Patent No.: US 10,767,939 B2
(45) Date of Patent: *Sep. 8, 2020

(54) DISCONNECT ASSEMBLY FOR ACTIVE COOLING OF PACKAGED ELECTRONICS

(71) Applicant: International Business Machines Corporation, Armonk, NY (US)

(72) Inventors: Gerd Schlottig, Uitikon Waldegg (CH); Stephan Paredes, Zurich (CH); Ingmar G. Meijer, Zurich (CH); Thomas Brunschwiler, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/665,046

(22) Filed: Oct. 28, 2019

(65) Prior Publication Data

US 2020/0072562 A1 Mar. 5, 2020

Related U.S. Application Data

(63) Continuation of application No. 16/030,097, filed on Jul. 9, 2018, now Pat. No. 10,527,365.

(51) Int. Cl.
*F28D 1/00* (2006.01)
*H05K 7/20* (2006.01)
*F28F 9/02* (2006.01)

(52) U.S. Cl.
CPC .......... *F28F 9/0258* (2013.01); *F28F 9/0251* (2013.01); *H05K 7/20309* (2013.01); *H05K 7/20327* (2013.01)

(58) Field of Classification Search
CPC .. F28F 9/0258; F28F 9/0251; H05K 7/20309; H05K 7/20327; H05K 7/20254;

(Continued)

(56) References Cited

U.S. PATENT DOCUMENTS 6,181,553 B1 * 1/2001 Cipolla .................. G06F 1/1632
165/104.33
6,508,301 B2 * 1/2003 Marsala ................ F25B 39/022
165/104.33

(Continued)

OTHER PUBLICATIONS

Goldman, R., et al., "Designing a Liquid Cooling Loop for High-Performance Systems", LYTRON Total Thermal Solutions, http://www.lytron.com/Tools-and-Technical-Reference/Application-Notes/Designing-a-Liquid-Cooling-Loop-for-High-Performance-Systems, Accessed on Jul. 6, 2018, 3 pages.

(Continued)

*Primary Examiner* — Jayprakash N Gandhi
*Assistant Examiner* — Michael A Matey
(74) *Attorney, Agent, or Firm* — Scully, Scott, Murphy & Presser, P.C.; Daniel P. Morris (57) ABSTRACT

A disconnect assembly includes a solid frame comprising a slit and a first liquid coolant circuit leading to a frame outlet defined in an inner wall of the slit. The assembly further includes an insert element, insertable in the slit so as to reach a sealing position. The latter defines a shut state, in which the insert element seals the frame outlet. The assembly includes a cold plate, comprising a second liquid coolant circuit with a duct open on a side of the cold plate. The cold plate can be inserted in the slit, so as to push the insert element, for the latter to leave the sealing position and the cold plate to reach a fluid communication position. This position defines an open state, in which the duct is vis-à-vis the frame outlet, to enable fluid communication between the first liquid coolant circuit and the second liquid coolant circuit.

19 Claims, 9 Drawing Sheets

(58) Field of Classification Search
CPC .......... H05K 7/20272; G06F 2200/201; F28D 2021/0028; F28D 9/0081
See application file for complete search history.

(56) References Cited

U.S. PATENT DOCUMENTS

| | | | |
|---|---|---|---|
| 7,298,617 | B2 | 11/2007 | Campbell et al. |
| 8,820,351 | B1 | 9/2014 | Harrington et al. |
| 9,066,460 | B2 | 6/2015 | Brunschwiler et al. |
| 9,261,311 | B2 | 2/2016 | Caradonna et al. |
| 9,426,931 | B2 * | 8/2016 | Kaplun ................ B23P 15/26 |
| 2006/0090489 | A1 * | 5/2006 | Haws ................. H05K 5/0213 62/176.6 |
| 2006/0146496 | A1 * | 7/2006 | Asfia ................. H05K 7/20672 361/700 |
| 2007/0235180 | A1 * | 10/2007 | Ouyang ................ H01L 23/473 165/287 |
| 2015/0298227 | A1 | 10/2015 | Mullner |
| 2017/0003083 | A1 * | 1/2017 | Manninen ............. F28D 15/025 |
| 2017/0030497 | A1 * | 2/2017 | Bai .................... H05K 7/20272 |
| 2018/0131128 | A1 * | 5/2018 | Franz ................... H01R 25/14 |

OTHER PUBLICATIONS

Kelkar, K.M., et al., "Analysis and Design of Liquid-Cooling Systems Using Flow Network Modeling (FNM)", http://inresllc.com/assets/files/macroflow/MF03-Design_of_Liquid_Cooling_Systems.pdf, Proceedings of IPACK03 International Electronic Packaging Technical Conference and Exhibition, Jul. 6-11, 2003, 6 pages.

List of IBM Patents or Patent Applications Treated as Related, dated Oct. 28, 2019, 2 pages.

* cited by examiner

DISCONNECT ASSEMBLY FOR ACTIVE COOLING OF PACKAGED ELECTRONICS

BACKGROUND

The present disclosure relates in general to the field of hardware cooling and in particular to active cooling solutions for packaged electronics. Embodiments of the invention are directed to assemblies of parts that can be inserted in slits of a solid frame housing a liquid cooling circuit, in order to open or shut sections of the cooling circuit.

Various approaches to cool hardware systems such as packaged electronics have been proposed. For instance, several active liquid-cooling solutions are known. In general, an active cooling system makes it difficult, if not impossible, to hot-plug elements of the system when the active liquid-cooling is on. Quick disconnect solutions have been proposed for hot plugging. However, such solutions are relatively complex and therefore expensive. In all cases, leakage of coolant in liquid-cooled systems is a risk, which can damage the hardware, especially while hot-plugging elements on which the packaged electronics are mounted.

SUMMARY

According to a first aspect, the present invention is embodied as a disconnect assembly for active cooling of packaged electronics. The assembly includes a solid frame that comprises a slit and a first liquid coolant circuit leading to a frame outlet defined in an inner wall of the slit. The assembly further includes an insert element, which is insertable in the slit so as to reach a sealing position. The latter defines a shut state, in which the insert element seals the frame outlet. Finally, the assembly includes a cold plate, which comprises a second liquid coolant circuit with a duct open on a side of the cold plate. The cold plate can be inserted in the slit, so as to push the insert element, for the latter to leave its sealing position and the cold plate to reach a fluid communication position. The latter position defines an open state, in which the duct is vis-à-vis the frame outlet, to enable fluid communication between the first liquid coolant circuit and the second liquid coolant circuit.

The invention may for example be embodied as a hardware system comprising the above disconnect assembly, as well as packaged electronics mounted on the cold plate, to thereby cool down electronics in operation of the system.

According to another aspect, the invention is embodied as a method of operation of an assembly for active cooling of packaged electronics. The assembly includes a solid frame, a cold plate and an insert element, as described above. According to this method, the insert element is inserted in the slit so as for it to reach a sealing position that defines a shut state, in which the insert element seals the frame outlet. Next, the cold plate is inserted in that same slit, so as to push the insert element, so as for the latter to leave the sealing position and the cold plate to reach a fluid communication position (open state), to enable fluid communication between the first liquid coolant circuit and the second liquid coolant circuit.

Devices, hardware systems and methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

The accompanying drawings show simplified representations of devices or parts thereof, as involved in embodiments. Details are sometimes omitted, for clarity. For example, the affixed packaged electronics are not depicted in the drawings shown in FIGS. 2-5, contrary to FIG. 1. Also, technical features depicted in the drawings are not necessarily to scale. Similar or functionally similar elements in the figures have been allocated the same numeral references, unless otherwise indicated.

DETAILED DESCRIPTION

Figure 1:
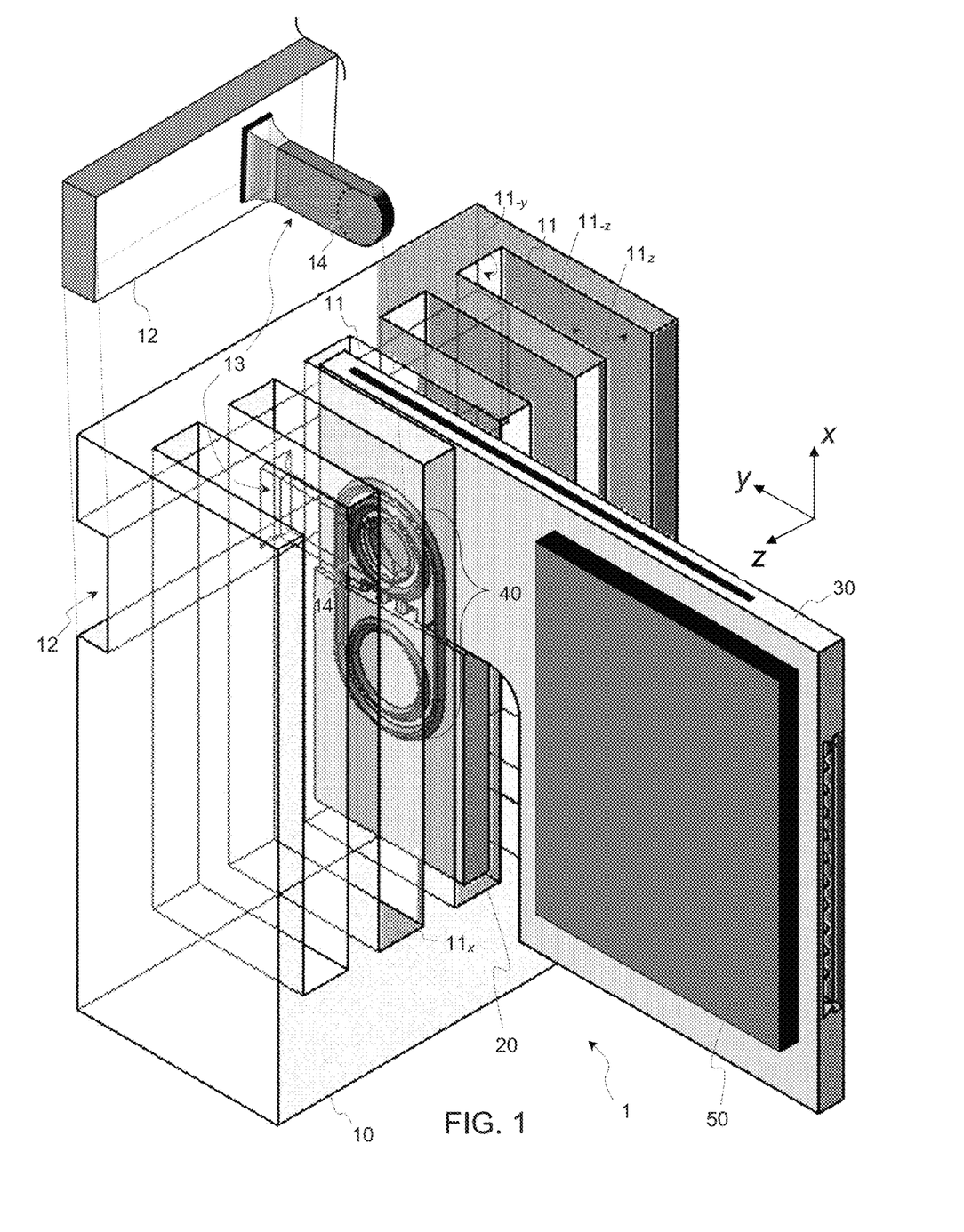
FIG. 1 is a 3D view of an assembly for active cooling of packaged electronics device, according to embodiments.

In reference to FIGS. 1 and 4, an aspect of the invention is first described, which concerns a disconnect (or connect/disconnect) assembly 1 for active cooling of packaged electronics 50.

Figure 5:
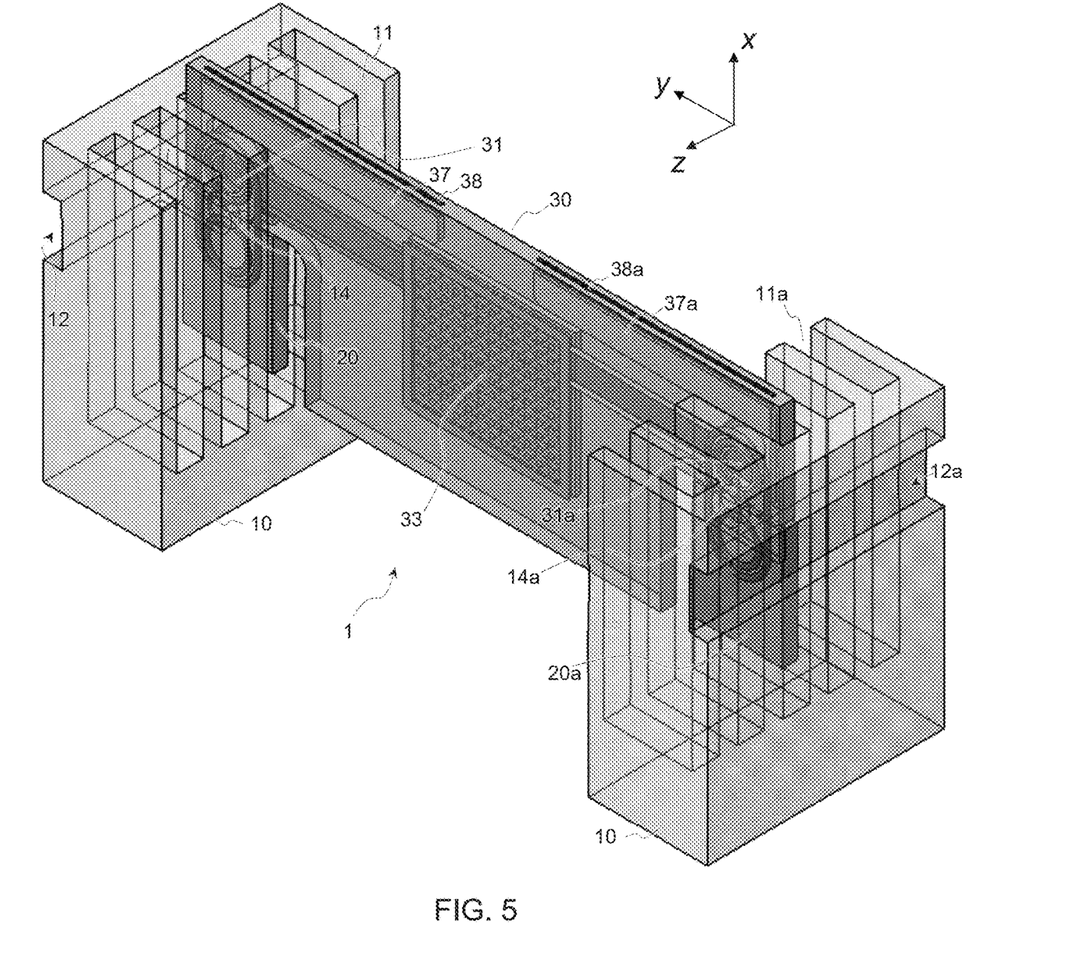
FIG. 5 is a 3D view of an assembly having a symmetric design, enabling a closed-loop cooling circuit, as in embodiments. Again, the affixed packaged electronics are not depicted, for clarity.

Basically, this assembly 1 includes a solid frame 10 and at least one set of movable elements, which set includes a cold plate 30 and at least one insert element 20, to switch the cooling circuit. The assembly 1, for example, has an essentially symmetric design with respect to plane (x, z), as illustrated in FIG. 5, though this is not strictly necessary. This aspect is discussed later in detail.

The solid frame 10 comprises at least one slit 11, although several slits will typically be involved, to allow dense package arrangements. In the frame 10 is defined a first liquid coolant circuit 12-14 (or circuit portion) for each slit 11, which circuit leads to a frame outlet 14. The outlet 14 is defined in the inner wall $11_{-z}$ of the slit 11 meant to receive movable elements 20, 30. Note, in the accompanying drawings, the inner walls of any slit 11 are identified according to indices corresponding to the normal vectors to such walls. Thus, the walls $11_z$ and $11_{-z}$ extend opposite to each other and perpendicularly to axis z. Similarly, the wall $11_x$ extends perpendicular to axis x, and the wall $11_{-y}$ extends adjacently between the walls $11_z$ and $11_{-z}$, etc.

Additional liquid circuit portions may otherwise be defined in the solid frame 10, which may typically comprise ducts 13 opening towards respective slits 11, so as to enable a coolant liquid to pass into corresponding circuit portions 12-14, as seen in FIG. 1. Each duct 13 may for instance communicate with a lateral channel 12, defined in the frame 10. Note, only one duct 13 and only one outlet 14 are visible in FIG. 1, for reasons of concision.

The insert element 20 is designed so as to be inserted in the slit 11, e.g., by pushing it into the slit. The insert element 20 can thus reach a sealing position in the slit 11. This sealing position defines a shut state of the corresponding liquid cooling circuit portion. In the sealing position, the insert element 20 seals the frame outlet 14 and therefore shut this circuit portion.

A second liquid coolant circuit 31-33 (or circuit portion) is defined in the cold plate 30. The circuit 31-33 notably includes a duct 31, and an extension portion 32. The duct is open on a side of the cold plate 30, so as to enable liquid to enter the duct 31 from that side. The cold plate 30 too is designed so as to be inserted in the slit 11. This way, the plate 30 may be brought in contact with and push the insert element 20 (in the direction opposite to that of axis x, see FIGS. 4A, 4B). As a result, the insert 20 will leave its sealing position, while the cold plate 30 may reach a fluid communication position, in which the duct 31 is (at least partly) vis-à-vis the frame outlet 14. This, in turn, enables fluid communication between the first circuit portion 1214 and the second circuit portion 31-33.

Note, a fluid communication position of a cold plate 30 defines an open state of the liquid cooling circuit. Now, as the insert 20 and plate 30 can be continuously moved along axis x in the slit 11, the aperture of the duct 31 may only partly overlap (in projection) with the aperture of the frame outlet 14 and thus only partly open the circuit. When the axis of the duct 31 coincide with the axis of the frame outlet 14, the overlap is maximal and the circuit is fully open. There, the circuit can be said to be in a fully open state. Still, one understands that there can in fact be several "fluid communication positions" of the cold plate 30 along x. I.e., the assembly may be designed in such a manner that there is a given, a finite interval of positions of the cold plate 30 for which fluid communication is enabled, yet in an extent that depends on the actual position of the plate 30.

Similarly, the sealing position may not be unique; there may be a finite interval of positions of the insert 20 that all result in sealing the circuit. However, there, the circuit is fully shut (or closed) for all such positions, as we shall see. Therefore, the overall circuit is either shut (by the insert 20), partly open (thanks to the cold plate's duct 31 being at least partly vis-à-vis the outlet 14) or fully open (when the axes of the duct 31 and outlet 14 coincide).

The present solutions allow quick connect/disconnect of cold plates 30 in an active cooling system for packaged electronics 50. As seen in FIG. 1, a packaged chip 50 may for example be mounted on one side of the plate 30. In variants (not shown), two packaged electronic components may be mounted on opposite sides of the plate 30. As further seen in FIG. 1, the solid frame 10 will likely comprise several slits 11, all designed for receiving respective inserts 20 and plates 30. The sets of slits 11, inserts 20 and plates 30 may all be similarly designed (this is not a strict requirement), so as to open or shut a liquid cooling circuit or a subsection thereof.

FIGS. 1-4 shows only one pair of insert element 20 and cold plate 30, for the sake of depiction. In the following, particular embodiments are described in reference to this pair of elements 20, 30, it being understood that the principles discussed herein can be extended to multiple sets of elements 11, 20, 30, as well as symmetric designs such as depicted in FIG. 5.

Figure 2A:
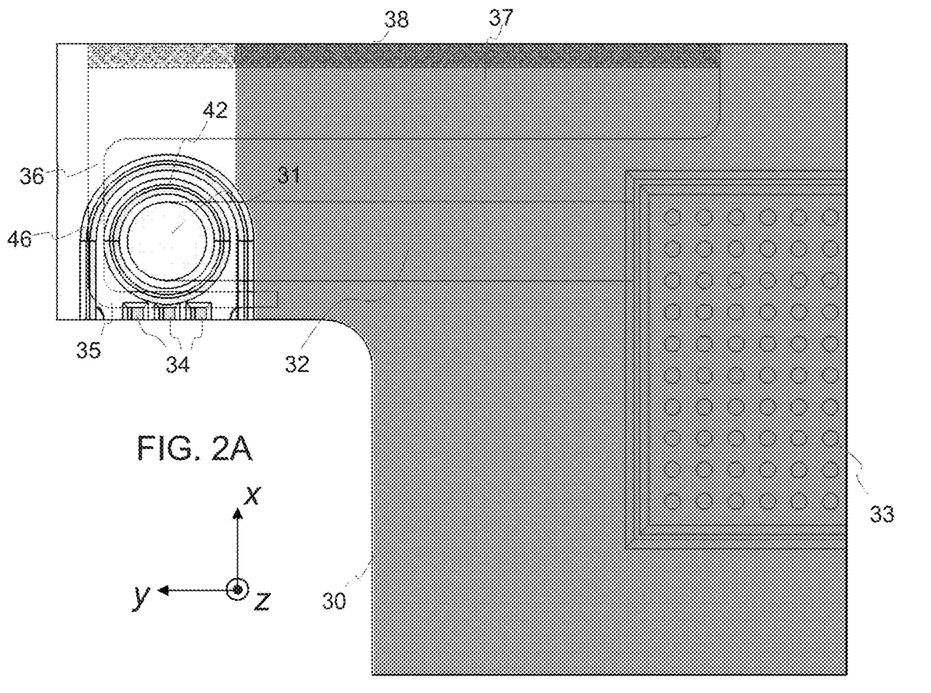
FIGS. 2A-2D show various views of the cold plate of the assembly depicted in FIG. 1 according to embodiments, wherein the affixed packaged electronics are not depicted, for clarity.
Figure 2B:
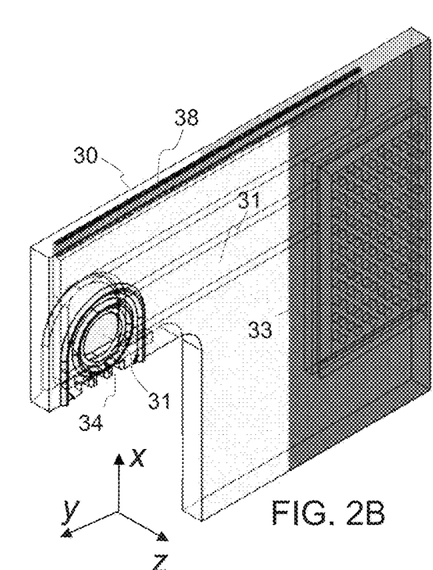
Figures 2C, 2D:
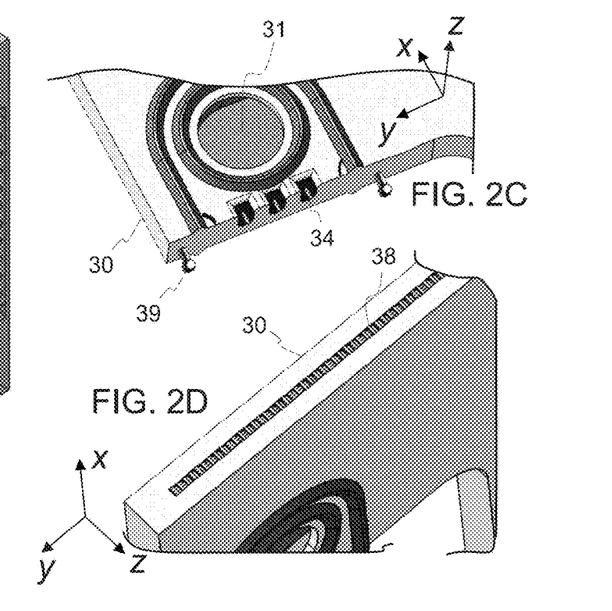
Figures 3A, 3B:
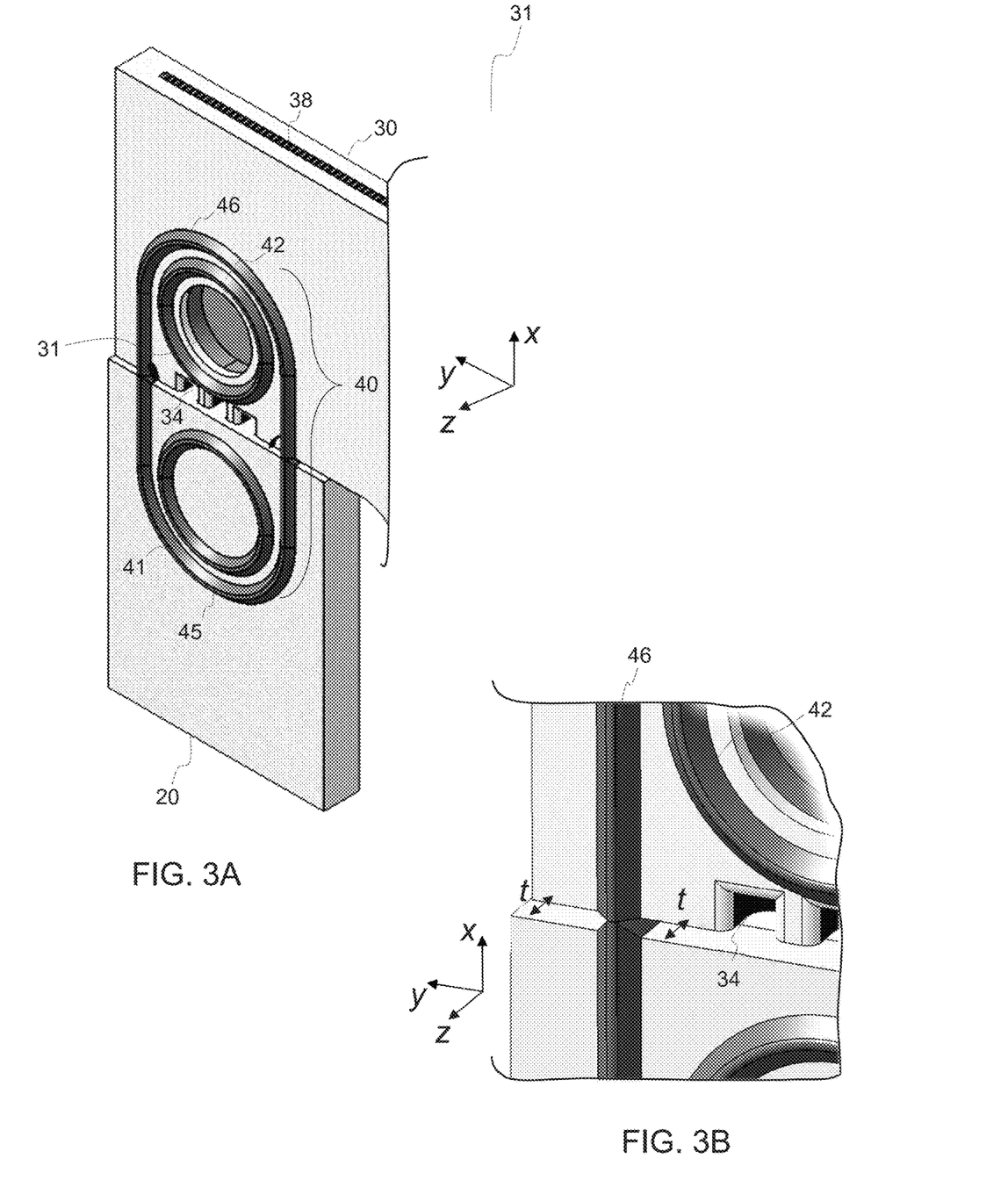
FIGS. 3A and 3B show details of the cold plate in contact with an insert element such as depicted in FIG. 1, as involved in embodiments.

Referring now to FIGS. 1-3, the disconnect assembly 1, for example, includes a gasket arrangement 40, which extends on both the insert element 20 and the cold plate 30. This gasket arrangement 40 is generally designed to prevent liquid leakage from the insert element 20 and the cold plate 30, in each of the sealed and open states of the corresponding liquid circuit, or circuit subsections. As seen in FIG. 1, the gasket arrangement 40 extends on a same side of the insert element 20 and the cold plate 30, when such elements 20, 30 are oriented so as to be inserted in the slit 11, to alter the state of a corresponding cooling circuit.

A sophisticated gasket arrangement 40 is, for example, contemplated, which allows each of the insert element 20 and the cold plate 30 to hold stable in a slit 11 without exerting force thereon (gravity will not appreciably impact the system's states here), while allowing such elements 20, 30 to be pushed further down in the slit, as necessary to switch from one state to the other. Interestingly, and as present Inventors have realized it, the gasket arrangement 40 may further be simply designed so as to prevent liquid leakage during a transition between a shut state and an open state of the liquid cooling circuit, as in embodiments discussed later.

To start with, and as best seen in FIGS. 2, 3, the gasket arrangement 40 may notably include a toric joint 42, which is arranged on the cold plate 30. This toric joint 42 surrounds the aperture of the duct 31 of the cold plate 30. This aperture is open on that side of the cold plate 30 that is facing the wall $11_{-z}$, when the plate 30 inserted in the slit 11. In addition, the toric joint 42 is dimensioned so as to surround the frame outlet 14 when the assembly is in a fully open state (i.e., the cold plate 30 is in an optimal fluid communication position, with the duct 31 right in front of the outlet 14), to prevent liquid leakage from the assembly 1 in that state.

The duct 31 and the frame outlet 14 shall typically have substantially the same diameter, though small discrepancies are possible, which can be compensated by the dimensions of the joint 42. The in-plane (inner) diameter of the joint 42 is at least equal to the diameter of the frame outlet 14, to prevent leakage in an open state of the circuit. Now, since the (inner) diameter of the joint 42 may be larger than the diameter of the frame outlet 14, one understands that there can be a finite interval of positions (corresponding to the difference of diameters between the ring 42 and the outlet 14) of the cold plates, for which the system is fully open.

In embodiments, the gasket arrangement 40 in fact includes two toric joints 41, 42, FIGS. 3A, 3B. A first toric joint 41 is located on the insert element 20, so as to surround the frame outlet 14 when the insert element 20 is in a sealing position. Again, the joint 41 may have a larger diameter than the outlet 14, such that there can be a finite interval of positions of the insert 20, for which the system is fully sealed. The second joint 42 is located on the cold plate 30, as described above. This way, the joints 41, 42 prevent liquid leakage from the frame outlet 14 when the system is either in a fully shut state or in a fully open state.

Moreover, as further seen in FIGS. 3A, 3B, the gasket arrangement 40 may further comprise a simple outer joint 45-46, to prevent leakage during transitions from one state to the other. The outer toric joint 45-46 actually decomposes into two halves 45, 46. The first half 45 is located on the insert element 20, on that side facing the wall $11_{-z}$, just like the first toric joint 41. The latter is partly surrounded by the first half 45 of the outer toric joint 45-46 on the insert 20. The second half 46 of the outer joint 45-46 is located on the cold plate 30, on that side facing the wall $11_{-z}$, like the second joint 42. And similarly, the joint 42 is partly surrounded by the second half 46 on that same side. Thus, when (if) the two parts 20, 30 are in contact in the slit 11, the two halves 45, 46 meet and form the outer toric joint 45-46 (see FIG. 3A). In that case, the toric joints 41, 42 happen to be both located within an inner area bounded by the outer joint 45-46, i.e., the area subtended by the outer joint 45-46 on elements 20, 30.

With such a configuration, the toric joints 41, 42 are side-by side on a same side of the cold plate 30 and the insert element 20 (though not necessarily in a same plane, owing to a possible slit t between surfaces of elements 20 and 30, as discussed later), and fully surrounded on that same side by the outer toric joint 45-46 that forms when the parts 20, 30 are in contact (FIG. 3A). The buffer area that is defined within the outer joint 45-46 but outside the inner joints 41, 42 define, together with the joints 41-46 (which protrude outwardly from their respective anchorage surfaces), a buffer volume in the slit 11. Liquid can accumulate in this buffer volume and be contained during a transition from one state to the other, to prevent leakage during such a transition.

The joints 41-46 are mechanical gaskets, which are typically shaped as tori (e.g., forming a loop with a rounded cross-section). Such joints are, for example, designed to be seated in respective grooves formed on respective anchorage surfaces of the insert 20 and plate 30. The joints 41-46 get compressed during the insertion of the parts 20, 30 in the slit, between their anchorage surfaces and the opposite wall $11_{-z}$ of the slit 11, which creates a seal at the interface. Still, the resulting friction can be pre-determined so as to be overcome by exerting a reasonable force on the insert and/or the plate. The joints are typically made from elastomer materials which are able to deform (to some extent) for the parts 20, 30 to tightly fill the slit 11 at the level of the joints 41-46.

In terms of dimensions, the joints 41 and 42 typically have identical or similar dimensions, with diameters that, for example, are between 2 mm and 10 mm, and for example, of about 5 mm. Their thickness (or height) is for, example, between 0.2 mm and 1.0 mm, and for example, of about 0.5 mm. The joints 45 and 46 typically have identical or similar dimensions too. Their dimensions may for instance be chosen such that the spacing between the joints 45 and 41 and the spacing between the joints 46 and 42 is between 0.2 mm and 2 mm, and for example, of about 0.5 mm. The apertures of ducts 14 and 31 typically have identical or similar dimensions, which are chosen such that the diameter is slightly smaller than the diameter of the joints 41 and 42. The diameters of such ducts, for example, are between 2 mm and 9 mm, and for example, of about 4 mm.

In terms of materials, the joints 41, 42, 45, and 46 are typically made from elastomer materials. Examples include: natural rubbers, silicone rubbers, fluorosilicone rubbers, butyl rubbers, polyurethanes, polytetrafluoroethylene (PTFE), and ethylene propylene diene monomer (M-class) rubbers (EPDM).

As further seen in FIG. 2C, the assembly 1 may further comprise fastening means 39, configured to help maintaining the two parts 20, 30 and, thus, the two halves 45, 46 forming the outer toric joint 45-46, in operation (see FIGS. 1, 3A and 4). Such fastening means 39 may for instance include hooks or other interlocking features (e.g., a snap-fit mechanism or other integral attachment features) that keep the two parts 20, 30 in contact after attachment, e.g., when sliding the insert 20 and the cold plate 30 in the slit 11. In FIG. 2C, such fastening means 39 are assumed to be realized as edges (rounded at the tips), which protrudes from the lower side of the plate 30 and are meant to be engaged in complementary snap-in cavities (not shown) realized in the insert element 20.

Bulging features (not shown) may possibly be provided in the frame 10, the insert 20, or, still, the cold plate 30, in order to further constrain the cross section of the joints 41-46, in order to improve the sealing action. For example, bulging features may be provided in the grooves in which the joints are received, to further constrain the joints.

As further seen in FIGS. 2 and 4, the cold plate 30 may advantageously include a liquid reservoir 37, as well as one or more apertures 34. The latter are notably open in the buffer area, i.e., on that side of the cold plate that faces the wall $11_{-z}$, within the inner area bounded by the outer joint 45-46, but outside the toric joints 41, 42. Such apertures 34 may easily be formed at an edge, as depicted in FIG. 2C, so as to be surrounded by the outer joint 45-46.

As further seen in FIGS. 2A and 2B, the liquid reservoir 37 forms part of a third liquid coolant circuit 34-38. The reservoir 37 is in fluid communication with the apertures 34, thanks to sections 35, 36 of the third liquid circuit portion 34-38. Note, the third circuit 34-38 is independent from the second 31-33. Instead, the third circuit 34-38 makes it possible to evacuate liquid coming from the frame outlet 14 toward the reservoir 37, during a transition from one state of the system to the other, in operation of the assembly 1. I.e., liquid in the buffer volume defined by the buffer area can exit through apertures 34 to reach the reservoir 37.

Note, additional ducts and/or reservoirs may possible be provided, in the cold plate 30 or in additional parts (no shown) of the system. In addition, adsorbing elements may possibly be provided (not shown), e.g., within the reservoir and/or the gap defined between the parts 20, 30 and the inner wall $11_{-z}$, to further reduce liquid spillage. Further adsorbing elements may also be attached to the insert element 20 or the cold plate 30. However, such adsorbing elements would ideally have a relatively large surface area. Thus, they may advantageously be attached to an inner side wall of the liquid reservoir 37. Other adsorbing elements may nevertheless be attached within the within the buffer area, i.e., on the insert element 20 (between the joints 45 and 41) and/or on the cold plate 30 (between the joints 46 and 42).

Figure 4A:
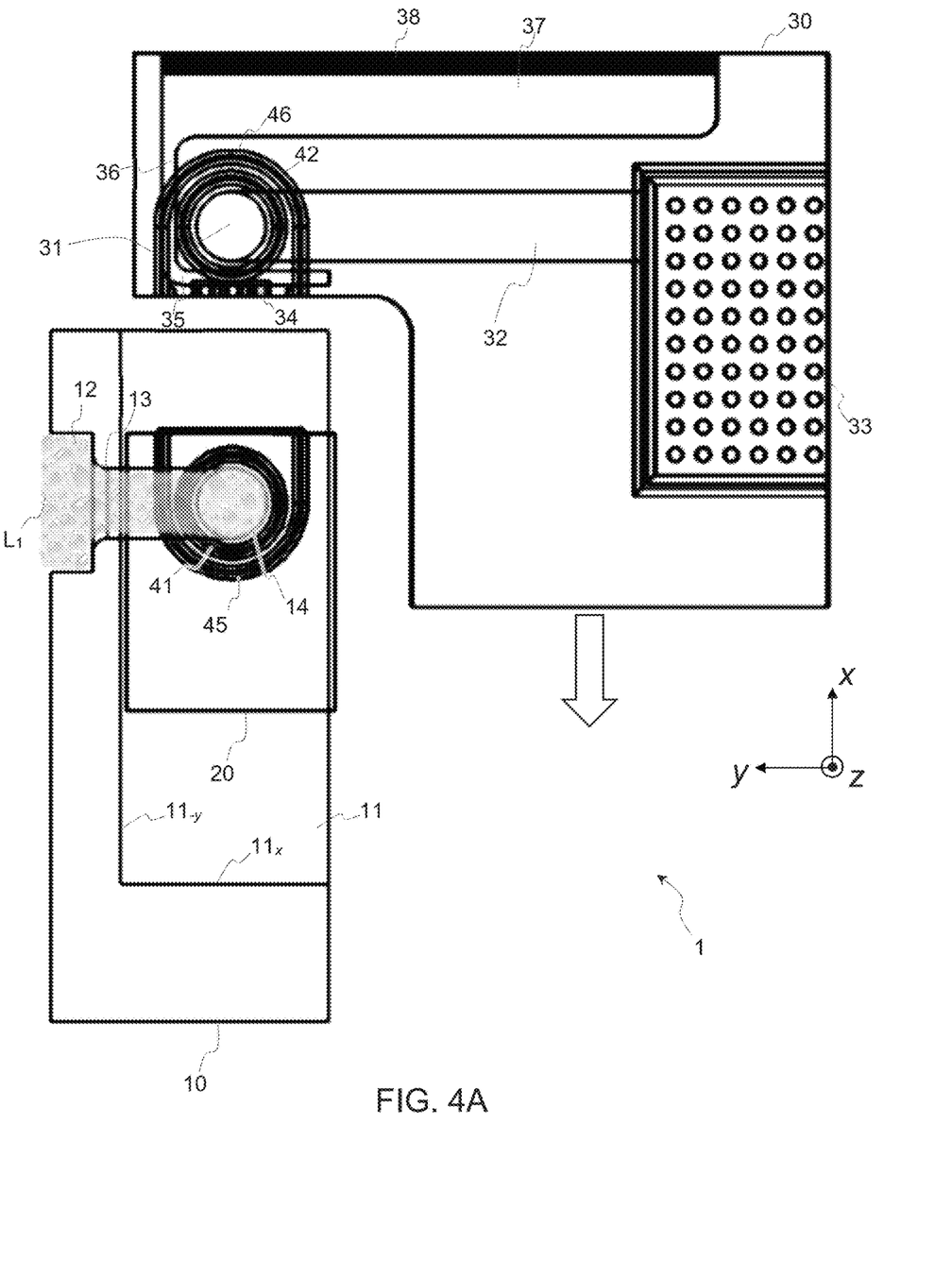
FIGS. 4A-4E are 2D, orthographic projection views of elements of the assembly of FIG. 1, illustrating the operation of such elements, according to embodiments.
Figure 4B:
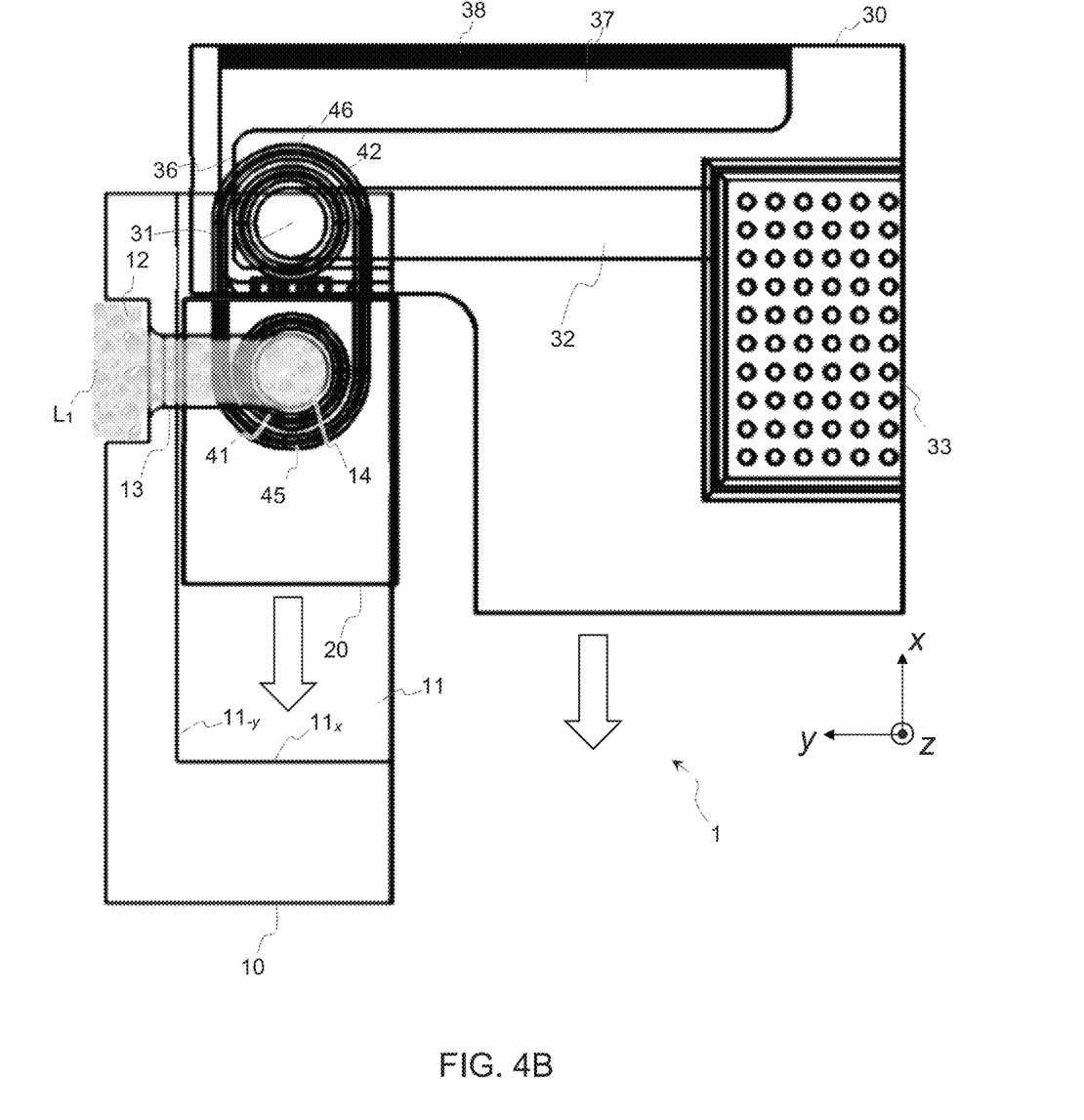
Figure 4C:
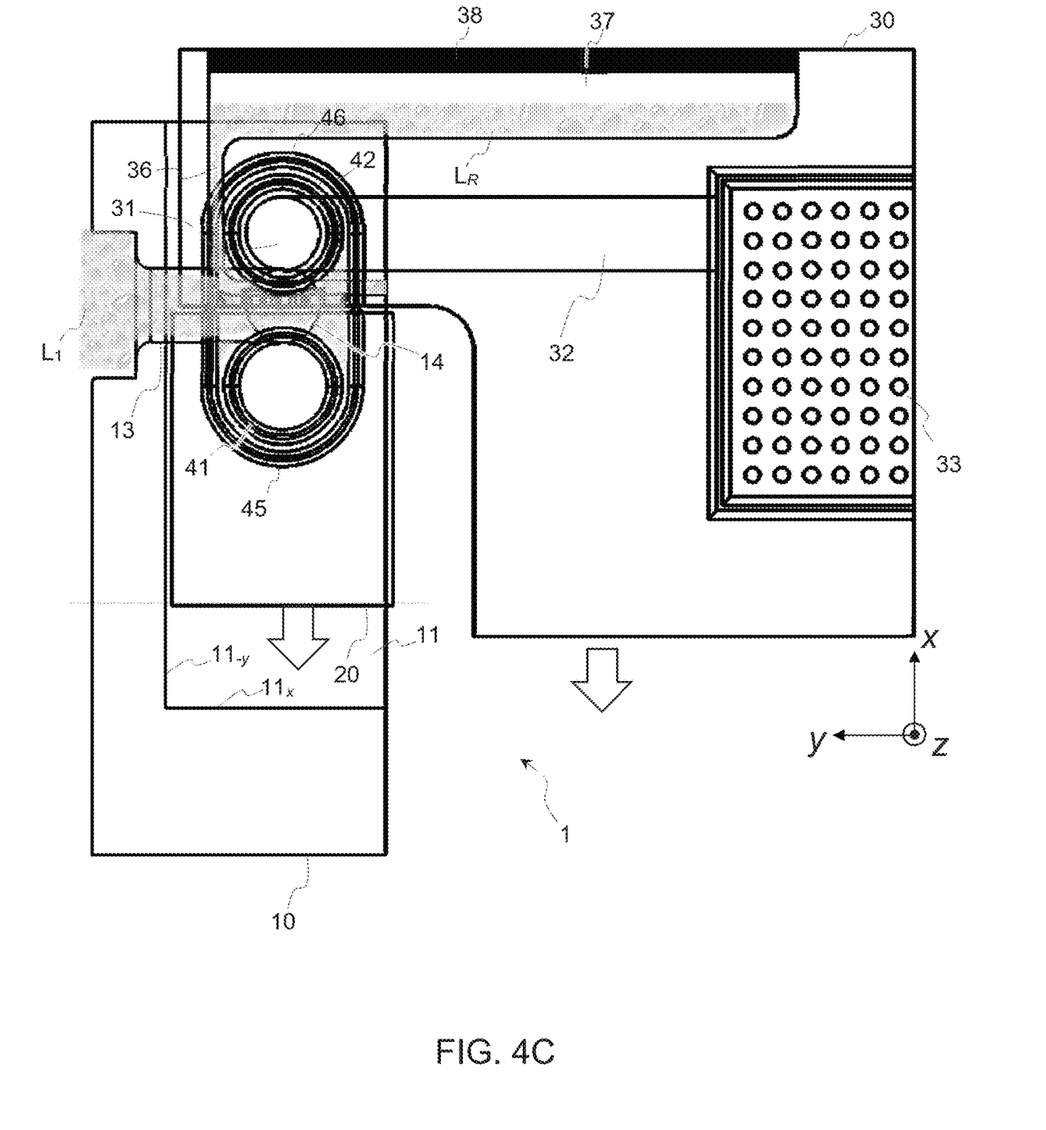
Figure 4D:
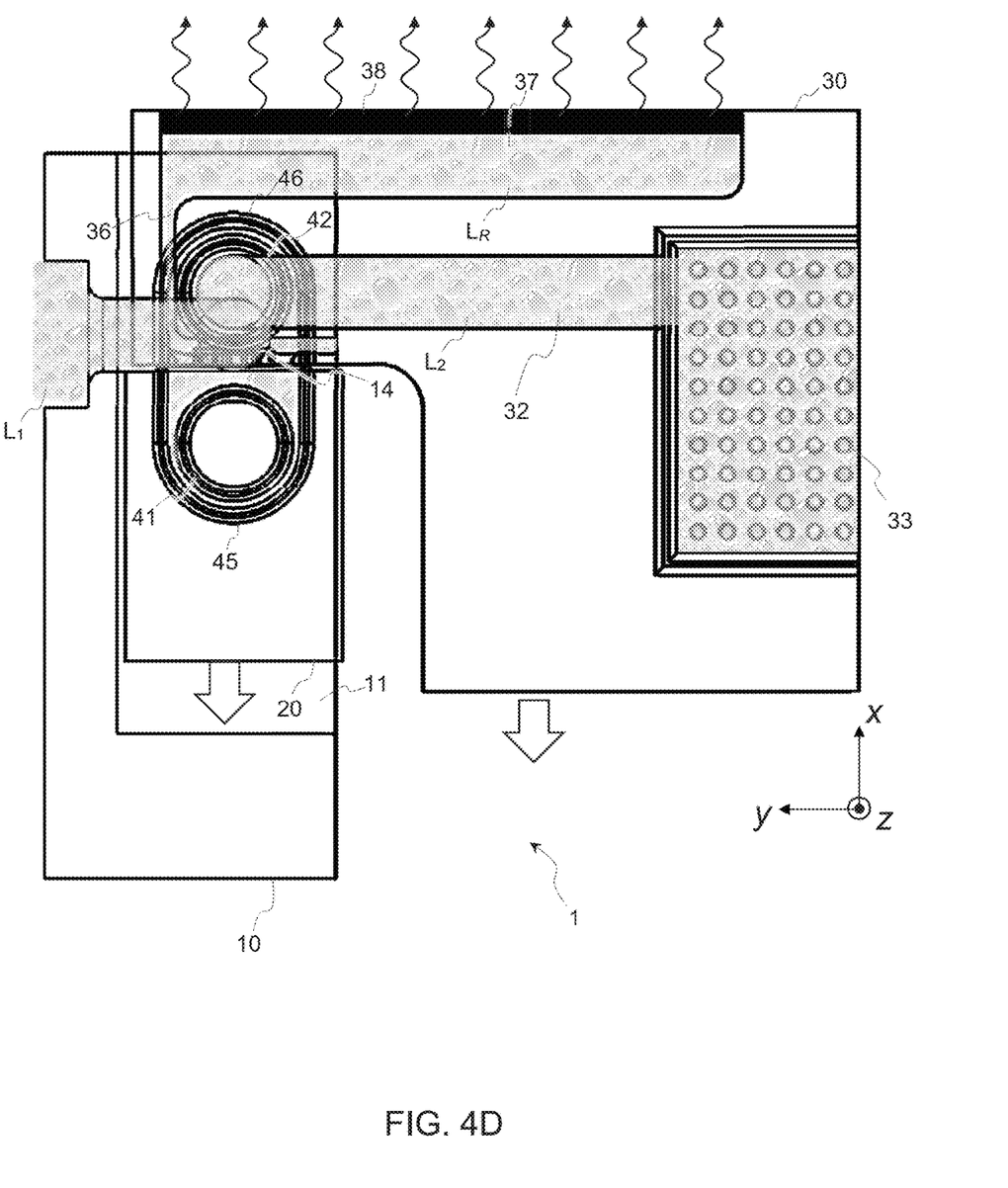
Figure 4E:
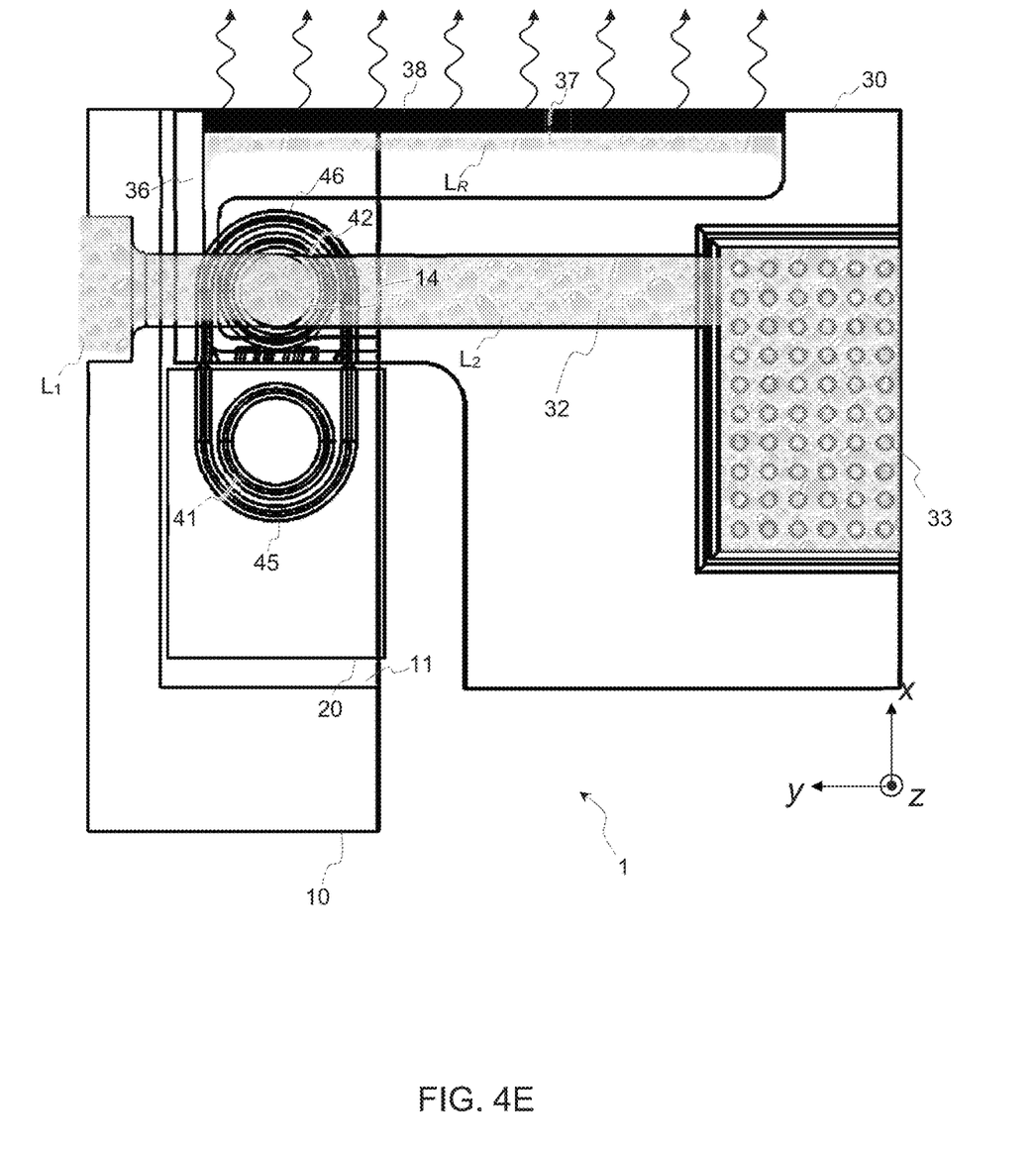

As illustrated in FIGS. 2A-B, and 2D, or otherwise suggested by FIG. 4D-E, the reservoir 37 is, for example, designed so as to allow evaporation of liquid accumulated therein, via an edge surface of the cold plate 30. E.g., the cold plate 30 may include a liquid evaporation medium 38 extending along its upper edge surface, to ease evaporation of the liquid $L_R$ (as accumulated in the reservoir) in air. This medium may for example be a porous medium 38 or a medium comprising capillary features (e.g., openings, pillars, etc.), on the upper edge surface of the cold plate 30.

Referring back to FIG. 3B, the sealing surfaces of the insert 20 and the plate 30 may typically have to be shifted with respect to each other in practice, e.g., due to manufacturing tolerances or other constraints for the thicknesses of parts 20 and 30. E.g., the face of the cold plate 30, on which the joint 42 is arranged, may thus have to be recessed by a distance t along the normal of that face, with respect to the face of the insert 20 on which the joint 41 is arranged. The recess gap t may thus impact the gap volume g defined between, on the one hand, the solid frame 10, and, on the other hand, both the insert 20 and the cold plate 30 when the insert 20 and the cold plate 30 are both inserted in the slit 11 and in contact. There, the joints 41-46 may have different thicknesses to compensate for this and thus all be level with each other (on the side of the inner wall $11_{-z}$), so as to all contact that inner wall $11_{-z}$ and ensure a homogeneous sealing action. Note, however, that a gap volume g exists even if t=0, owing to the residual heights of the joints 41-46. I.e., a gap volume g is in all cases ensured by the residual heights of the compressed joints 41-46 above their respective anchorage surfaces. Now, if the surfaces 20, 30 are shifted with respect to each other, then the residual heights of the joints 42, 46 need to differ from the residual heights of the joints 41, 45 for the upper edges of the joints to be all flush. In all cases, liquid may accumulate in the gap volume g during transitions between the shut and open states of the liquid cooling circuit, to prevent leakage.

As evoked earlier, each joint 41-46 may be partly embedded under its respective anchorage surface, in order to ensure a satisfactory anchorage of the joints. That is, all toric joints may be anchored (e.g., thanks to grooves) on a same side of elements 20, 30. Although same types of joints will normally be used, joints of different section diameters may be used to compensate for a possible thickness mismatch t between elements 20 and 30, as evoked above. Similarly, different embedding level (resulting from different anchorage groove dimensions or shapes) may be relied on to compensate for the mismatch t. In all cases, the top edges of the joints can be made level with each other, so as to ensure a suitable fit and sealing. Still, the compressibility of the joints may compensate for slightly non-level joints.

As further seen in FIGS. 2, 4, the cold plate 30 may further comprise liquid cooling structures 33, which are arranged in a volume defined at an end of the second circuit 31-33, within the plate 30. Such structures 33 may for example be realized as structures protruding from a basis surface (defined within the plate 30), so as to effectively increase the surface area contacting the liquid accumulated in the plate and improve the cooling.

In embodiments shown in FIGS. 1-4, only one lateral side of the parts 10-30 is shown and, as said earlier, the assembly 1 need not be symmetric. However, it for example is, be it to ease insertion of the parts 20, 30 within opposite slits 11, 11a, as discussed now in reference to FIG. 5.

As seen in FIG. 5, each of the solid frame elements 10, 10a and the cold plate 30 may be symmetrically designed (with respect to the plane (x, z). Note, the solid frame may further include a chassis (not shown, below the sabots 10, 10a), so as to substantially have a U-section in the plane (x, y). In such a symmetric design, at least one pair of opposite slits 11, 11a are meant to receive the parts 20, 30. Also, in that case, the first liquid coolant circuit 12-14, 12a-14a now comprises two subsections, i.e., the subsections 12-14 and 12a-14a subtended by the two frame outlets 14, 14a, which are oppositely located on lateral edges of the frame 10.

Note, a single insert element 20 could be used to shut the liquid circuit, by inserting this element in a pair of opposite slits. However, in order to maximize the useful area of the plate 30, best is to use a suitably profiled insert or, even, two insert elements 20 (as in FIG. 5), where each of the elements 20, 20a can be inserted in a respective one of the opposite slits 11, 11a, on each lateral side of the frame elements 10, 10a. Both inserts 20, 20a may reach their respective sealing positions, to seal the circuit portions 12-14 and 12a-14a, which are thus disconnected. I.e., this result in a shut state of the corresponding section of the liquid cooling circuit, where the first and second insert elements 20, 20a seal a respective frame outlet 14, 14a.

As further suggested by the symmetric arrangement of FIG. 5, the second liquid coolant circuit now comprises two ducts 31, 31a, which are both open on a same side of the cold plate 30. The cold plate 30 can be pushed further down in the slits 11, 11a, so as to push each insert 20, 20a, for the latter to leave their sealing positions. This way, the cold plate 30 can reach a fluid communication position, which defines an open state, in which each duct 31, 31a is (at least partly) vis-à-vis a respective frame outlet 14, 14a, to connect subsections 12-14, 12a-14a of the first circuit via the second circuit 31-31a.

Using symmetric designs such as depicted in FIG. 5 allows a simple operation of the assembly 1. I.e., the circuit sections can be connected/disconnected by gently pushing/pulling the plate 30. IC packages (not shown) mounted on the respective plates 30 can thus easily be hot plugged/unplugged, even if the active cooling circuit is switched on. Also, in a symmetric design, two or more reservoirs 37, 37a may be provided in the cold plate 30, to buffer liquid on each side and prevent leakages during the mounting or de-mounting of the cold plate 30. One or more liquid cooling structures 33 may be present too, which have the same function as described earlier.

Furthermore, the first circuit subsections 12-14, 12a-14a and the second circuit portion 31-33 may, once connected, form a loop, corresponding to a subsection of a larger liquid cooling circuit, it being noted that the same lateral channels 12, 12a may service several loops, each corresponding to a respective pair of opposite slits 11, 11a. The overall circuit may be a closed cooling circuit, wherein liquid is recirculated to cool the plates 30. In variants, the overall circuit may be open, whereby liquid would be filled at one of the channels 12 and evacuated from the other, opposite channel 12a.

Although the discussion so far was merely circumscribed to the description of the operation pertaining to a single plate 30, embodiments of the present invention will likely involve several pairs of opposite slits 11, 11a, allowing connection/disconnection of several cold plates 30, by means of several inserts 20 (or pairs of inserts 20, 20a). This way, dense packaged electronics may be cooled and yet easily connected/disconnected, following the same principles as discussed above.

In that respect, and according to another aspect, the invention may be embodied as a hardware system (e.g., a computerized system), where the system comprises a disconnect assembly 1 such as described herein, as well as packaged electronics 50 mounted on the cold plate 30, or somehow attached to the plates 30, to thereby cool down the packaged electronics 50, in operation of the system. The packaged electronics may for instance include, each, one or more chips, e.g., memory chips, mounted on a printed circuit board (PCB) to form an integrated-circuit (IC) package 50. Sockets (not shown), solder pads (not shown) or other interconnects, will ensure proper connections of the IC packages. Such interconnects may, however, be provided on other components of the system, outside the assembly 1.

Referring to FIGS. 4A-E, a method of operation of an assembly 1 or a system such as described above is now briefly discussed, which concerns another aspect of the invention. Main aspects of this method have already been evoked earlier in the description of the components 10-30. Essentially, this method requires to first insert an insert element 20 in a slit 11, so as for the insert element 20 to reach a sealing position, in which the element 20 seals a frame outlet 14, see FIG. 4A, or a pair of outlets 14, 14a, in a symmetric design. Thus, liquid $L_1$ coming from the lateral channel 12 remains confined in the conduit 13. I.e., this position defines a shut state of the circuit section formed by the first and second liquid cooling subsections. Then, a cold plate 30 is inserted in that same slit 11, see FIG. 4A-B.

When the plate 30 comes in contact with the insert 20 (FIG. 4B), it starts pushing the insert element 20, such that the latter progressively leaves its sealing position, FIG. 4C. There, liquid $L_1$ starts filling the buffer volume between the inner 41, 42 and outer joints 45, 46. Thanks to apertures 34 (see FIG. 2), liquid $L_R$ starts filling the third circuit section 34-38 and thus reaches the reservoir 37 (FIG. 4C).

Pushing the cold plate 30 and insert 20 further down, the cold plate 30 reaches a position that already enables fluid communication, FIG. 4D. That is, the duct 31 and outlet 14 are not perfectly in via-à-vis yet but, still, liquid $L_2$ can already pass into the second circuit portion 31-33. This new position defines a partly open state of the cooling circuit and liquid $L_2$ can notably reach the cooling structures 33 provided in the plate 30. Meanwhile, liquid $L_R$ has filled the reservoir 37 and starts evaporating, thanks to an evaporation medium 38.

Pushing further down, the cold plate 30 reaches a plain fluid communication position, FIG. 4E, which defines a fully open state of the cooling circuit (the duct 31 is now perfectly vis-à-vis the frame outlet 14). Liquid $L_2$ is still filling the cooling compartment 33, while residual liquid $L_R$ in the reservoir 37 is being sucked into the medium 38 (e.g., by capillarity), which liquid can thus evaporate through the medium 38, until no liquid remains. No additional liquid is being drained through the third circuit 35-37 at this point as the duct 31 faces the frame outlet 14, which is sealed by the joint 42. As said earlier, liquid $L_2$ that fills the cooling compartment 33 may further reach a complementary circuit portion 12a (on the opposite side of the frame 10) and possibly be recirculated, if the overall circuit forms a closed-loop.

A disconnect assembly for active cooling of packaged electronics, in embodiments, includes a solid frame that comprises a slit and a first liquid coolant circuit leading to a frame outlet defined in an inner wall of the slit. The assembly further includes an insert element, which is insertable in the slit so as to reach a sealing position. The latter defines a shut state, in which the insert element seals the frame outlet. The assembly includes a cold plate, which comprises a second liquid coolant circuit with a duct open on a side of the cold plate. The cold plate can be inserted in the slit, so as to push the insert element, for the latter to leave the sealing position and the cold plate to reach a fluid communication position. This position defines an open state, in which the duct is vis-à-vis the frame outlet, to enable fluid communication between the first liquid coolant circuit and the second liquid coolant circuit. Related devices, systems and methods of operation may be provided.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A disconnect assembly for active cooling of packaged electronics, the assembly comprising:
    a solid frame comprising a slit and a first liquid coolant circuit portion leading to a frame outlet defined in an inner wall of the slit;
    an insert element, insertable in the slit so as to reach a sealing position defining a shut state to seal the frame outlet; and
    a cold plate, comprising a second liquid coolant circuit portion with a duct open on a side of the cold plate, wherein the cold plate is insertable in the slit so as to push the insert element for the insert element to leave the sealing position and the cold plate to reach a fluid communication position defining an open state, in which the duct is vis-à-vis the frame outlet.

2. The disconnect assembly according to claim 1, further comprising
    a gasket arrangement extending on both the insert element and the cold plate, the gasket arrangement designed to prevent liquid leakage from the insert element and the cold plate in each of said shut state and said open state.

3. The disconnect assembly according to claim 2, wherein the gasket arrangement is further designed to prevent liquid leakage from the insert element and the cold plate during a transition from said shut state to said open state.

4. The disconnect assembly according to claim 3, wherein the gasket arrangement comprises a toric joint, located on the cold plate, wherein the toric joint surrounds an aperture of the duct open on said side of the cold plate, so as to surround the frame outlet if the cold plate is in the fluid communication position and prevent liquid leakage from the frame outlet in the open state.

5. The disconnect assembly according to claim 4, wherein the toric joint is a second toric joint, the gasket arrangement comprising a first toric joint located on the insert element, so as to surround the frame outlet if the insert element is at the sealing position and prevent liquid leakage from the frame outlet if the assembly is in the shut state.

6. The disconnect assembly according to claim 5, wherein the gasket arrangement further comprises:
    an outer toric joint divided in two halves, comprising:
        a first half located on the insert element, on a same side as the first toric joint, the latter partly surrounded by the first half of the outer toric joint on that same side; and
        a second half located on the cold plate on a same side as the second toric joint, the latter partly surrounded by the second half on that same side, whereby the two halves meet and form the outer toric joint if the cold plate contacts the insert element in the slit, so as for the first toric joint and the second toric joint to be located within an area bounded by the outer toric joint.

7. The disconnect assembly according to claim 6, wherein the assembly further comprises an interlocking device configured to help maintaining said two halves forming the outer toric joint, in operation.

8. The disconnect assembly according to claim 6, wherein the cold plate further comprises:
    a liquid reservoir; and
    an aperture open on the side of the cold plate, outside the second toric joint, so as for the aperture to be surrounded by the outer toric joint, and wherein the liquid reservoir is in fluid communication with the aperture, via a third liquid coolant circuit portion that is independent from said second liquid circuit portion, so as to evacuate liquid coming from the frame outlet toward the reservoir during a transition from the shut state to the open state, in operation of the assembly.

9. The disconnect assembly according to claim 8, wherein said reservoir is designed so as to allow evaporation of liquid accumulated therein via an edge surface of the cold plate.

10. The disconnect assembly according to claim 9, wherein the cold plate further comprises a liquid evaporation medium extending along an edge of the cold plate, the evaporation medium interfacing a volume defined in said reservoir with an external environment medium to the cold plate.

11. The disconnect assembly according to claim 6, wherein a face of the cold plate, on which the second toric joint is arranged, is shifted along a normal of that face with respect to a face of the insert element on which the first toric joint is arranged.

12. The disconnect assembly according to claim 6, wherein each of the two halves of the outer toric joint, the first toric joint and the second toric joint is partly embedded under a respective anchorage surface of the insert element.

13. The disconnect assembly according to claim 6, wherein each of the two halves of the outer toric joint, the first toric joint and the second toric joint is partly embedded under a respective anchorage surface of the cold plate.

14. The disconnect assembly according to claim 1, wherein the cold plate further comprises liquid cooling structures arranged in a volume defined within the cold plate, at an end of the second liquid coolant circuit portion.

15. The disconnect assembly according to claim 1, wherein each of the solid frame and the cold plate is symmetrically designed and the assembly further comprises a second insert element, whereby the first liquid coolant circuit portion of the solid frame comprises two disconnected subsections and the cold plate is insertable in a pair of opposite slits of the solid frame, so as to push insert elements therein and connect the subsections via the second liquid coolant circuit portion.

16. The disconnect assembly according to claim 15, wherein the first liquid coolant circuit portion and the second liquid coolant circuit portion form parts of a liquid cooling circuit portion pathing through the solid frame and the insert element, which liquid cooling system is, in the open state, a closed liquid circuit portion.

17. The disconnect assembly according to claim 1, wherein the solid frame comprises:

n slits and n corresponding first liquid coolant circuit portions leading to respective frame outlets, the latter defined, each, in an inner wall of a respective one of the n slits, n>1;

n insert elements, wherein each of the insert elements is insertable in a respective one of the n slits so as to reach a sealing position defining a shut state, in which said each of the n insert elements seals a respective one of the frame outlets; and n cold plates with n second liquid coolant circuit portions, each of the cold plates comprising a respective duct open on a side thereof, the duct leading to a respective one of the n second liquid coolant circuit portions, wherein each of the cold plates is insertable in a respective one of the slits so as to push a respective one of the insert elements, for the latter to leave its sealing position and said each of the cold plates to reach a fluid communication position that defines an open state, in which a respective duct is vis-à-vis one of the frame outlets to enable fluid communication between one of the n first liquid coolant circuit portions and one of the second liquid coolant circuit portion.

18. A hardware system comprising the disconnect assembly according to claim 1, and packaged electronics mounted on the cold plate, to thereby cool down the packaged electronics, in operation of the system.

19. A method of operation of an assembly for active cooling of packaged electronics, wherein the assembly comprises a solid frame comprising a slit and a first liquid coolant circuit portion leading to a frame outlet defined in an inner wall of the slit, the method comprising:

inserting an insert element in the slit so as for it to reach a sealing position defining a shut state, in which the insert element seals the frame outlet; and inserting a cold plate in that same slit, the cold plate comprising a second liquid coolant circuit portion and a duct open on a side of the cold plate, the duct leading to the second liquid coolant circuit portion, so as to push the insert element for the latter to leave the sealing position and the cold plate to reach a fluid communication position defining an open state, in which the duct is vis-à-vis the frame outlet.

* * * * *

UNITED STATES PATENT AND TRADEMARK OFFICE
CERTIFICATE OF CORRECTION

PATENT NO. : 10,767,939 B2
APPLICATION NO. : 16/665046
DATED : September 8, 2020
INVENTOR(S) : Gerd Schlottig et al.

Page 1 of 1

It is certified that error appears in the above-identified patent and that said Letters Patent is hereby corrected as shown below:

On the Title Page

Item (72), should read:
(72) Inventors: Gerd Schlottig, Uitikon Waldegg, (CH);
Stephan Paredes, Zurich, (CH);
Gerhard Ingmar Meijer, Zurich, (CH);
Thomas Brunschwiler, Thalwil, (CH)

Signed and Sealed this
Eighth Day of December, 2020

Andrei Iancu
*Director of the United States Patent and Trademark Office*